United States Patent [19]

Donnelly et al.

[11] 4,397,711

[45] Aug. 9, 1983

[54] CRYSTALLOGRAPHIC ETCHING OF III-V SEMICONDUCTOR MATERIALS

[75] Inventors: Vincent M. Donnelly, Berkeley Heights; Daniel L. Flamm, Chatham Township, Morris County; Dale E. Ibbotson, Westfield, all of N.J.

[73] Assignee: Bell Telephone Laboratories, Incorporated, Murray Hill, N.J.

[21] Appl. No.: 432,317

[22] Filed: Oct. 1, 1982

[51] Int. Cl.³ .................... H01L 21/306; B44C 1/22; C03C 15/00; C03C 25/06
[52] U.S. Cl. .................................... 156/643; 156/646; 156/647; 156/659.1; 156/662; 204/192 E; 252/79.1
[58] Field of Search ............... 156/643, 646, 647, 651, 156/659.1, 662, 345; 204/164, 192 E, 298; 252/79.1

[56] References Cited

U.S. PATENT DOCUMENTS 4,354,898 10/1982 Coldren et al. ............... 156/647

OTHER PUBLICATIONS

M. W. Geis et al., "A Novel Anisotropic Dry Etching Technique," *Journal of Vaccum Science Technology,* 19(4) 1390–1393, Nov./Dec. 1981.

*Primary Examiner*—William A. Powell
*Attorney, Agent, or Firm*—Bruce S. Schneider

[57] ABSTRACT

Crystallographic etching in III–V semiconductor materials such as GaAs is achieved, for example, by utilizing a suitable halogen containing entity such as chlorine, bromine and iodine. This crystallographic etching yields in one embodiment essentially vertical surfaces of optical quality. Therefore, the procedure is useful in fabricating integrated circuits and in producing optical devices.

8 Claims, 4 Drawing Figures

CRYSTALLOGRAPHIC ETCHING OF III-V SEMICONDUCTOR MATERIALS

BACKGROUND OF THE INVENTION

1. Field of the Invention

This invention relates to semiconductor devices and, in particular, semiconductor devices based on III-V materials.

2. Art Background

The etching of semiconductor materials in device fabrication is a well practiced art. In particular, the etching of III-V semiconductor materials has been performed by a variety of expedients. For example, both wet chemical etching (etching done utilizing a liquid etch) and dry etching (etching typically performed in a reactive gas and/or plasma discharge gas environment) have been employed.

Each of these etching techniques have their own attributes, and generally are used in the specific situations for which they are best suited. In the case of wet chemical etching, typically a relatively smooth surface on the walls of the etched feature is achieved. These smooth surfaces are desirable in applications such as those involving reflective surfaces for optical devices. (Surface smoothness for the purpose of this invention is defined with respect to the area of a series of adjoining but not overlapping specifically defined imaginary squares. These squares each 800 Å on a side (or in the case of a sidewall being considered for smoothness, squares whose side is 800 Å or one-half the smallest dimension of the wall, whichever is smaller) are oriented so that the sum of the distance from all points, along a chosen portion of the surface being considered for smoothness, measured perpendicularly to the square corresponding to this portion is a minimum and so that the square all together cover essentially the entire projected region of the surface being considered for smoothness, but no more. Then once the squares are defined, the sum of all the areas defined by the projections perpendicular from all the points on the surface of features overlying the square which at their extreme points are removed a perpendicular distance of no more than 500 Å measured perpendicular to the square underlying the feature, plus the sum of all the areas defined by the projections perpendicular from all the points on the surface of voids underlying the square which at their extreme point are removed a perpendicular distance of no more than 500 Å is divided by the sum of the areas of all the squares. (Overlying denotes the direction from the surface of the material away from the bulk of the etched material and underlying denotes the direction from the surface of the material into the bulk.) Typically, a smooth surface is one where this percentage is less than 20 percent, generally for wet etching less than 5 percent.) However, wet chemical etching such as that described in Y. Tarul et al, *Journal of Electrochemical Society*, 118, 118 (1971) or S. Adachi, *Journal of the Electrochemical Society*, 128, 1342 (1981) usually yields nonvertical etched walls, a wall with a curved surface, or an unacceptably small vertical to horizontal etched aspect ratio. (A nonvertical wall in the context of this invention is a wall which diverges from the normal to the original surface more than 10 degrees. The aspect ratio is the ratio of the maximum distance etched vertically to the maximum distance etched horizontally in any plane underneath the mask.) Therefore, wet chemical etching is generally not appropriate for applications such as mirror facets on optical devices, where vertical walls or high aspect ratios are required.

Dry etching procedures are often used precisely for the applications in which wet chemical etching is not appropriate, e.g., applications where a vertical wall with a high aspect ratio is required. Such dry etching is usually performed by striking a discharge in a gas and subjecting the material to be etched to the chemical entities formed in the discharge. The etching is ultimately achieved through chemical reaction of discharge entities with the substrate. This reactive etching is sometimes accompanied by enhanced removal of substrate material through kinetic impact of the gas discharge entities with the substrate. Although such procedures are quite advantageous in situations where vertical walls and high aspect ratios are required, generally the walls which are produced are relatively rough (typically a smoothness of worse than 30 percent). Thus, situations which require a smooth wall and lend themselves to wet chemical etching are often not congruous with dry etching. Additionally, ion assisted plasma etching often causes substantial damage near the surface of the etched material. Such surface damage can cause degradation both to optical and electrical properties while impeding subsequent epitaxial deposition. Ion etching also requires a precisely controlled smooth edged mask for processing procedures. Although such masks are producible, their preparation increases the cost of device fabrication.

For some very demanding applications, such as required in the fabrication of integrated optical components, a combination of attributes is desirable. For many devices used in optical components, a smooth and extremely flat surface is desirable, i.e., a surface in which adjoining but not overlapping squares (as defined above, but with sides of 100 Å) form an angle of less than two degrees with respect to any square as defined above but with 5000 Å sides. Such smooth, flat surfaces are typically not available even in wet chemical etching. Other strictures are imposed in optical component fabrication. Light beams processed in, for example, an integrated optical component typically propagate, in a direction parallel to the surface of the substrate. To avoid distortion of the propagating light with an associated loss of information, it is often necessary that the walls of optical devices in the integrated component be essentially vertical. Nevertheless, the combined requirements of essentially vertical, well-defined and extremely smooth, flat walls have not been satisfied with one process.

SUMMARY OF THE INVENTION

In etching III-V semiconductor materials based on GaAs and InP, smooth, flat etch walls are achievable through the use of a specific etching procedure. Both the binaries, GaAs and InP, and the ternaries and quaternaries of these two binary materials are encompassed. Not only are smooth walls producible but also through an appropriate choice of mask orientation there is control over the configuration of these walls so that desired vertical walls and/or nonvertical walls are produced. Additionally, again by the choice of an appropriately oriented mask, the etched walls correspond to crystallographic planes and thus, walls corresponding to the same plane are parallel as dictated by the crystal structure of the material being etched. Thus, without a detailed mask, self-aligned, precisely oriented walls are attained.

To produce the desired effect, the III-V material being etched is subjected to an appropriate gas for the material such as one of those selected from chlorine, bromine, iodine entities or a combination of these halogen entities. The interaction of an appropriate etchant with the III-V material causes differential crystallographic etching, i.e., etching that proceeds in directions dictated by the crystallographic planes of the material being etched at a rate which strongly depends on the particular plane. By appropriately orienting the sample mask on an appropriate crystallographic plane, feature walls essentially perpendicular to this plane are producible. Additionally, by an appropriate choice of mask orientation other crystallographic angles are available. It is possible to produce these etch feature walls with good smoothness, e.g., as good as 5 percent. Thus, the procedure yields results that are useful in the production of optical devices, and in particular, optical devices employed in integrated optics.

DETAILED DESCRIPTION

Figure 1:
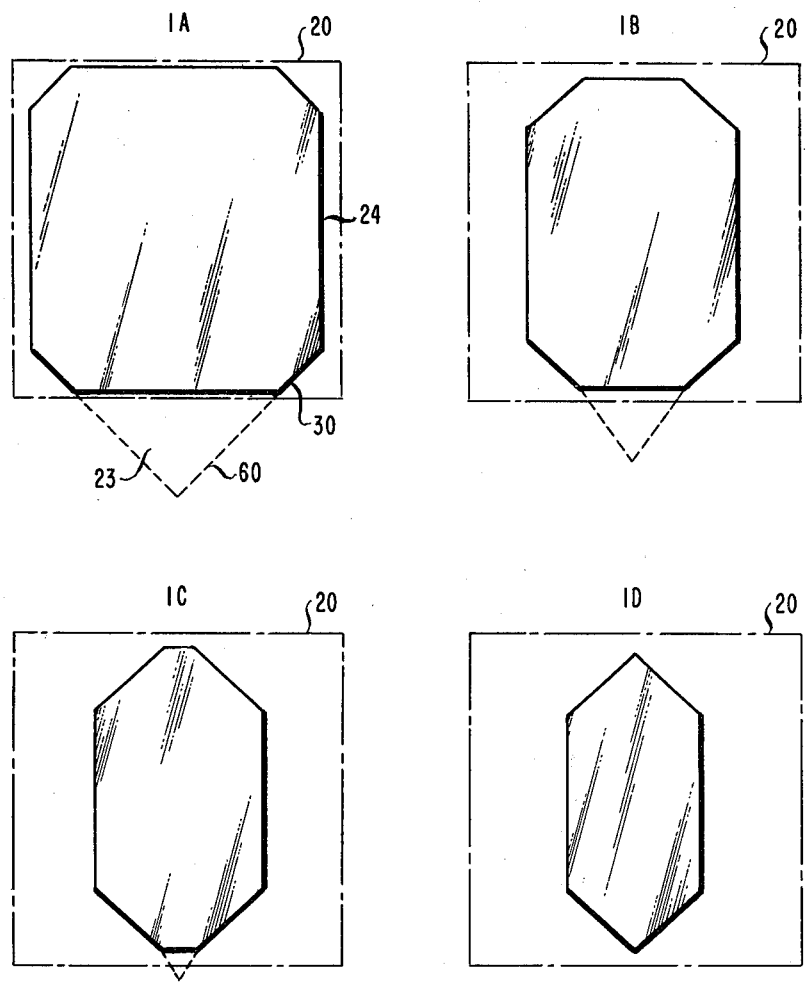
FIGS. 1 through 4 illustrate results obtained with the inventive process.

As discussed, etching which produces self-aligned, precisely controlled walls and smooth surfaces relies on the use of specific etchants to produce differential crystallographic etch rates for different crystal planes of III-V semiconductor materials based on GaAs, InP or the ternaries or quaternaries formed from these two binaries. The particular configuration of the walls of the etch feature produced, as previously discussed, depends on the orientation of the mask. (Obviously, since the mask is supported by the surface of the substrate, the crystallographic plane of the surface determines one aspect of the mask orientation. The orientation of the mask is, thus, entirely fixed by also specifying its shape and its position on the surface plane relative to crystallographic axes lying parallel to the plane of the surface.) To ensure that a specific crystallographic plane is formed as one of the etch feature walls, the mask is oriented so that (1) the desired plane includes the direction defined by a tangent to a point on the periphery of the mask where the tangent is in the plane of the mask, (2) it is possible to describe a normal to the desired plane as a linear combination with positive coefficients of (A) a vector perpendicular to the substrate surface at this point, and directed away from the substrate, and (B) a vector in the surface, perpendicular to the tangent at this point and directed away from the mask, and (3) all other planes which (I) intersect this desired plane which (II) also include the specified tangent direction and which (III) have a normal that satisfies criterion 2, etch faster than the desired plane under the etching conditions employed. To exemplify, if the mask is square, four directions as defined by the four sides of the mask are specified. Thus, since there are two pairs of parallel directions, initially two sets of crystallographic planes are developed by etching, i.e., the etch walls are in one of two crystallographic planes. Similarly, if the mask is circular, a multitude of tangential directions are defined and initially the development of many crystallographic planes occurs.

The actual configuration of the etch feature obtained once the mask orientation is chosen, then depends upon how long the etch procedure is continued. Eventually, the above described planes, as etching continues, intersect. (It is possible depending on the mask shape that upon initial etching these planes intersect.) After intersection and upon further etching, two results are possible. If the intersecting planes etch faster compared to all other crystallographic planes which have a normal that is oriented within the included solid angle, then only the two intersecting planes continue to develop, i.e., continue to propagate. (The included solid angle is the smallest solid angle bounded by three intersecting lines: (1) a normal to each intersecting plane, and (2) the vector perpendicular to the initial surface of the substrate and directed away from the substrate.) In the second situation, if one or more of these other alternate crystallographic planes exists which etch faster than the two intersecting planes, then the slowest etching of these alternate planes begins to develop so that an etch wall oriented in the direction of this alternate plane is interposed between the two initially intersecting planes. Thus, as shown in the plan views of FIG. 1, where the phantom structure, 20, at 1A indicates the mask, when two planes, 23 and 24, intersect if etching continues after their intersection, a third faster etching plane, 30, (if it exists) develops. As etching continues, the wall defined by the faster etching planes grows larger and the walls defined by the initially intersecting planes grow smaller. If etching continues and there is sufficient material remaining to etch, the walls defined by the two intersecting planes, they ultimately disappear leaving only the intermediary plane, 30. (Although this discussion for pedagogical reasons has been in terms of the intersection of only one pair of planes, it is possible, and likely, that there will be other planes which develop for a particular mask orientation that will also intersect. At these additional intersections, the same process occurs.)

Figure 3:
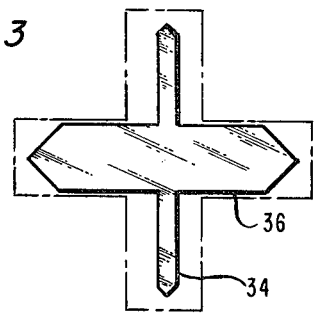

To illustrate the process for a specific example, the plan views of FIG. 1 show the etch progression where a rectangular mask positioned on a (100) GaAs plane with its edges parallel to the (011) and (01$\bar{1}$) planes is employed. (The phantom line, 20, shows the periphery of the mask and the dashed triangle indicates a wall going in a direction below the plane of the paper.) After a relatively long etching period, an underlying hexagonal shape is produced. Similarly, as shown in FIG. 3, a mask in the form of a cross overlying a (100) GaAs plane with the arms of the cross respectively parallel to the <01$\bar{1}$> and <011> directions, yields after a relatively long etch, the pattern shown in FIG. 3 where 34 and 36 are lines defined by the intersection with the mask of the developed (01$\bar{1}$) and (011) planes which are perpendicular to the surface. In the case of the square mask, the {100} fast etching planes result upon intersection of the initially developing {110} and {111} planes. It also should be noted that both the faster etching planes, in the GaAs illustration, which develop after initial intersection of the slow etching planes, as well as certain of the slow etching planes, include the <100> direction of the surface normal. Thus, by positioning the mask on the (100) surface essentially vertical etch walls are obtainable.

The provision of a desired crystallographic surface for the mask is accomplished by conventional and well-known techniques such as by saw cutting a substrate from a boule of single crystal material along a suitable crystallographic plane and polishing a major surface of the substrate by a chemical and/or mechanical process. Similarly if the supporting surface is the surface of an epitaxial layer, the crystallographic orientation of the surface upon which the layer is deposited as determined by, for example, suitably cutting a boule, in turn, determines the orientation of the deposited layer. As also discussed, the shape of the mask and its position on the surface of the material to be etched also contributes to its orientation and thus to the configuration of the etch walls ultimately obtained. For the etches typically employed in the inventive process, conventional mask materials such as $SiO_2$ are employed. These materials are shaped and positioned by well-known lithographic techniques.

It is possible in specific situations that in developing particular crystallographic planes as the walls of the etched feature, the amount of etching required to produce the desired result also causes undercutting of the mask, i.e., etching of material which initially underlaid the mask. Thus, the mask employed to delineate the substrate so that etching occurs to produce appropriately positioned etch walls should be appropriately dimensioned (once shape and position is determined) to allow for the particular degree of undercutting, if any, produced.

The etchant and the etching conditions employed should be those which produce differential etch rates between different crystallographic planes. In particular the etchant and the etchant conditions employed should, as discussed previously, yield crystallographic etch rates for specific planes which cause the desired crystallographic planes to develop into a suitable etch wall configuration. For III-V semiconductor materials based on InP and GaAs, differential crystallographic etching is obtained by employing a suitable etchant for a given material chosen from compositions including chlorine entities, bromine entities, iodine entities or a combination of these entities. (A halogen entity is a compound, compound fragment, atom or molecule containing the corresponding halogen.) These entities are producible by a variety of procedures. For example, it is possible to strike a discharge in a halogen containing gas, e.g., bromine, and direct the entities produced in the discharge into contact with a GaAs substrate at an elevated temperature, e.g., 100 degrees C. It is often desirable to produce this contact in a position removed from the discharge environment to avoid contamination from electrode material and ion induced surface damage. This spatially removed contact is accomplished by striking a discharge and allowing the entities produced to flow or diffuse towards the substrate to be etched. Alternatively, it is possible to position the delineated material in the discharge region between the electrodes which are employed to produce the discharge. Rather than forming halogen entities in a discharge, a vapor of the particular molecular halogen, e.g., bromine, in the absence of a discharge is also useful for etching. For example, a bromine or iodine vapor is produced by passing a carrier gas such as helium through a heated vessel containing the appropriate halogen or employing the generated vapor without a carrier.

The relative rate of etching for specific crystallographic planes not only varies with the etchant but also with the temperature of the substrate being etched and with the concentration of the etchant. Typically, the higher the temperature and concentration the faster the absolute etch rates attained. Generalizations concerning the behavior of relative etch rates of the planes with temperature and concentration are not possible. However, typically to produce desirable results (smooth self-aligned surfaces) for GaAs or InP temperatures in the range 80 degrees C. to 200 degrees C. and 180 degrees C. to 215 degrees C., respectively, and etchant concentrations in the range $1 \times 10^{14}$ $cm^{-3}$ to $3 \times 10^{18}$ $cm^{-3}$, are employed. At higher temperatures or concentrations the etching process becomes difficult to control while at lower temperatures etching is inhibited by etch product accumulation on the surface, or in the case of low etchant concentrations in a plasma at low pressure ($<50$ $\mu m$) and/or low frequency ($<2$ MHz) by competition with anisotropic etching induced by ion bombardment. At extremely high-power densities competition from ion bombardment enhanced etching occurs and should be avoided.

The etchant concentration is easily controlled. When a plasma is utilized to generate the desired etchant, the discharge power and the discharge gas concentration is utilized to determine the etchant concentration. When a vapor is employed, the concentration is easily controlled by conventional gas handling techniques. In either the gas flow or discharge case, a controlled sample is utilized to determine a suitable set of conditions for a particular desired concentration.

As previously discussed, the etchant and the etching conditions should be chosen to produce a differential etch rate between crystallographic planes. This differential should be greater than 1:1, preferably at least 1.5:1. For example, in the case of GaAs, $Br_2$ produces a suitable differential between the relatively slowly etched {110} planes and the relatively rapidly etched {100} planes. In the case of InP, $I_2$ produces a suitable differential etch rate between planes.

Generally other parameters involved in the etching procedure are not critical. For example, in the case of plasma generated etchants, the frequency in an RF discharge which is employed to produce the etchant, has little effect on the etching procedure provided extremely high powers at low frequencies and/or low pressures ($<50$ $\mu m$) are avoided.

The following examples are illustrative of conditions utilized in the crystallographic etching of the subject invention.

EXAMPLE 1

A substrate of GaAs was cut from a single crystal boule so that the surface of the substrate laid in a (100) plane. The wafer was doped with silicon to an n-type majority carrier concentration of $10^{18}$. The substrate was cleaned by standard techniques and polished with a bromine/methanol etch. A 2000 Å-thick layer of plasma deposited $SiO_2$ was formed on the major surface of the substrate. The silicon dioxide layer was then delineated using conventional lithography to form a mask which consisted of squares (220 $\mu m$ on a side) and crosses (with the arms of the crosses of equal size and measuring 27.7 $\mu m \times 137.5$ $\mu m$) arranged in alternating rows of squares and crosses with each pattern being separated by 770 $\mu m$ on center from the adjacent pattern. An edge of each square and of each cross was oriented along the $<011>$ direction and along the $<01\bar{1}>$ direction. (An etch pit determination using bromine/methanol solution was employed to ensure that the mask patterns were oriented along the appropriate direction.) Both the surface of the mask and the surface of the substrate were cleaned and etched by successively immersing the substrate in a methylene chloride, acetone, and methanol bath. These treatments were followed by a 20 second etch in a 3 to 1 by volume $H_2O$/HCl solution. (The acid solution removed any traces of native oxide which might impede subsequent etching.) The wafer was blown dry with dry nitrogen.

The sample was placed on the grounded electrode of a radial flow, parallel plate plasma reactor. The electrodes were formed from hard coat, anodized aluminum and the vacuum seals were chosen to be resistant to the etchant. Both electrodes were steam heated to a temperature of 100 degrees C. The electrodes were separated by a Pyrex ® ring which was sealed to each electrode using a gasket. The ring internally measured 19.8 cm diameter and 4 cm in height. The chamber was sealed and evacuated to a pressure of approximately 5 mm. Liquid bromine was held in a vessel and its temperature was regulated using a constant temperature bath at 20 degrees C. The vapor over the bromine was then flowed through a flowmeter at a rate of approximately 30 sccm. This flow produced a pressure of approximately 0.3 Torr as measured by a capacitance manometer positioned downstream from the reactor chamber. An RF discharge was struck using a frequency of 14 MHz and a power density of approximately 0.1 W/cm$^2$. (The power density was measured by multiplying the signals from voltage and current probes.) The etch was conducted for a desired period of time, the discharge was then extinguished, the bromine flow was terminated, the bromine removed, and the chamber back-filled with dry nitrogen.

Figure 2:
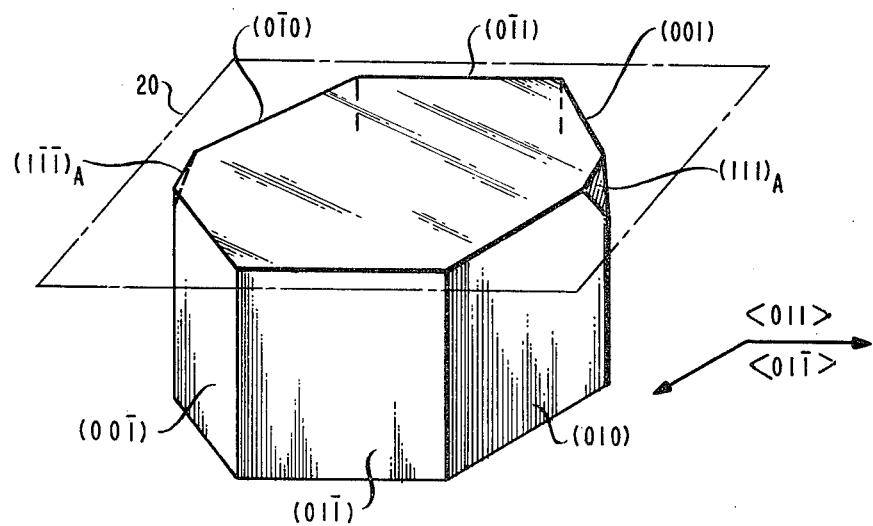

FIG. 1 shows a plan view of the shapes obtained as the etching progressed. (The phantom line, 20, indicates the position of the mask and the dashed line, 60, indicates a plane not perpendicular to the mask going below the plane of the paper. The form corresponding to the configuration at 1C is shown in FIG. 2. The walls of the etch feature were smooth as observed by electron microscopy.

EXAMPLE 2

The procedure of Example 1 was followed except the plasma was not struck. The results obtained were approximately the same except that the relative plane propagation rates were somewhat different, etching was slower and therefore the extent of undercutting for each plane as compared to the results of Example 1 was somewhat different.

EXAMPLE 3

The procedure of Example 1 was followed except the sample was placed downstream from the plasma. In particular, the sample was generated by flowing bromine vapor through a phosphoric acid coated quartz tube placed between electrodes which were separated by 2.5 cm. The sample was placed approximately 20 cm downstream from the electrodes. Essentially the same results were obtained as in Example 1 but with somewhat different undercutting.

EXAMPLE 4

The procedure of Example 1 was employed except chlorine was utilized as the etchant. The chlorine was introduced as a gas at approximately the same flow rate as described for the bromine in Example 1. The results were essentially the same as described in Example 1 including the degree of undercutting.

EXAMPLE 5

A wafer of n-type InP ($10^{18}$ majority carrier concentration) was cut from a boule of single crystal InP so that the (100) plane was in the major surface of the sample. This wafer was then cleaved. A 2000 Å-thick layer of silicon dioxide was deposited on the sample using conventional deposition techniques. A conventional photoresist was applied to the silicon dioxide layer and circular openings measuring 100 μm in diameter were made in the resist and the exposed SiO$_2$ was removed by etching in a buffered HF aqueous solution. A 200 A-thick layer of chromium was then evaporated onto the sample followed by an evaporation through conventional techniques of a 2000 Å-thick layer of gold. The resist was removed utilizing acetone and the silicon dioxide was also removed utilizing a buffer-oxide etch. The sample was cleaned by sequentially immersing it in boiling chloroform, boiling acetone, and boiling methanol. The wafer was then immersed in a 50 percent by volume HF aqueous solution for 10 seconds to remove any native oxide.

Figure 4:
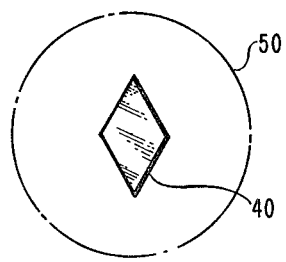

The sample was again cleaved to yield a 2 mm×2 mm specimen. The specimen was placed on silicon wafers which covered the grounded electrode of a parallel plate reactor. The electrodes were spaced approximately 1 cm apart and were resistively heated to a temperature of approximately 190 degrees C. The chamber was evacuated to a pressure of approximately 10 μm. An argon flow was established through the chamber while allowing the ambient temperature to stabilize. Solid iodine was heated to a temperature of approximately 60 degrees C. and the resulting vapor was flowed through a needle valve. The flow was adjusted to yield a pressure of approximately 0.15 Torr in the reactor. An RF plasma was established using a frequency of 13 MHz and a power density of approximately 0.3 W/cm$^2$. The etch was continued for approximately one hour. The discharge was extinguished, the iodine flow was terminated, and the reactor was back-filled with dry nitrogen. The etch pattern attained is shown in the plan view of FIG. 4 where 40 is the etch pattern and 50 is the mask.

What is claimed is:

1. A process for etching semiconductor bodies, said bodies comprising a composition based on III–V semiconductor materials chosen from the group consisting of GaAs, InP, ternaries of InP and GaAs, and quaternaries of InP and GaAs, wherein at least a portion of said body is masked with a masking material and said body is subjected to a gaseous etchant under conditions which cause etching of said body characterized in that said etchant and said conditions are chosen to produce a differential etch rate between crystallographic planes of said material and said mask is oriented so that (1) at some point along the periphery of said mask a crystallographic plane exists which includes the direction defined by a tangent at said point, (2) said crystallographic plane etches more slowly than all other crystallographic planes which intersect said chosen plane and which also include said direction, and (3) a normal to said crystallographic plane is a linear combination with positive coefficients of (A) a vector perpendicular to the surface of said body at said point in a direction away from said body, and (B) a vector lying in said surface, perpendicular to said tangent, and directed away from said mask.

2. The process of claim 1 wherein said composition comprises GaAs.

3. The process of claim 1 wherein said composition comprises InP.

4. The process of claim 1 wherein said etchant comprises an entity including a halogen chosen from the group consisting of bromine, chlorine, and iodine.

5. The process of claim 1 wherein said walls have a smoothness of better than 20 percent.

6. The process of claim 2 wherein said mask overlies a (100) plane.

7. The process of claim 6 wherein said tangent is parallel to the $<01\bar{1}>$ direction or the $<011>$ direction.

8. The process of claim 3 wherein said mask overlies a (100) plane.

* * * * *

UNITED STATES PATENT AND TRADEMARK OFFICE
CERTIFICATE OF CORRECTION

PATENT NO. : 4,397,711

DATED : August 9, 1983

INVENTOR(S) : Vincent M. Donnelly, Daniel L. Flamm, and Dale E. Ibbotson

It is certified that error appears in the above—identified patent and that said Letters Patent is hereby corrected as shown below:

Column 1, line 37, "square" should read --squares--. Column 4, line 51, "(011)", first occurrence, should read --(01$\bar{1}$)--. Column 10, line 4, "<01$\bar{1}$>" should read --<011>--, "<011>" should read --<01$\bar{1}$>--.

Signed and Sealed this

Eighth Day of November 1983

[SEAL]

Attest:

Attesting Officer

GERALD J. MOSSINGHOFF

Commissioner of Patents and Trademarks